US011264309B2

(12) United States Patent
Chang

(10) Patent No.: US 11,264,309 B2
(45) Date of Patent: Mar. 1, 2022

(54) MULTI-ROW QFN SEMICONDUCTOR PACKAGE

(71) Applicant: MEDIATEK INC., Hsin-Chu (TW)

(72) Inventor: Chin-Chiang Chang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 3 days.

(21) Appl. No.: 16/868,511

(22) Filed: May 6, 2020

(65) Prior Publication Data

US 2020/0402893 A1 Dec. 24, 2020

Related U.S. Application Data

(60) Provisional application No. 62/865,392, filed on Jun. 24, 2019.

(51) Int. Cl.
*H01L 23/495* (2006.01)

(52) U.S. Cl.
CPC .. *H01L 23/49503* (2013.01); *H01L 23/49517* (2013.01); *H01L 23/49541* (2013.01)

(58) Field of Classification Search
CPC ......... H01L 23/49503; H01L 23/49517; H01L 23/49541
USPC ................................................. 257/670, 666
See application file for complete search history.

(56) References Cited

U.S. PATENT DOCUMENTS

| | | | | |
|---|---|---|---|---|
| 5,367,124 A * | 11/1994 | Hoffman | ........... | H01L 23/49582 174/552 |
| 6,552,417 B2 * | 4/2003 | Combs | ................ | H01L 23/4334 257/666 |
| 6,583,499 B2 | 6/2003 | Huang | | |
| 6,713,849 B2 * | 3/2004 | Hasebe | .................... | H01L 24/49 257/667 |
| 8,163,604 B2 * | 4/2012 | Ong | .................... | H01L 21/4832 438/123 |
| 8,183,680 B2 * | 5/2012 | Zhao | ................. | H01L 23/49503 257/687 |
| 2004/0080025 A1 * | 4/2004 | Kasahara | ............ | H01L 21/4828 257/666 |
| 2006/0035414 A1 * | 2/2006 | Park | .................. | H01L 23/49548 438/124 |
| 2007/0267734 A1 * | 11/2007 | Zhao | ................. | H01L 23/49503 257/687 |
| 2008/0001263 A1 | 1/2008 | Dimaano | | |

(Continued)

FOREIGN PATENT DOCUMENTS

| | | |
|---|---|---|
| TW | 200300596 | 6/2003 |
| TW | 200307359 | 12/2003 |
| TW | 200607070 | 2/2006 |

*Primary Examiner* — Nitin Parekh
(74) *Attorney, Agent, or Firm* — Winston Hsu

(57) ABSTRACT

A semiconductor package includes at least one die attach pad of a leadframe, at least one semiconductor die mounted on the at least one die attach pad; and a plurality of lead terminals disposed around the at least one die attach pad and electrically connected to respective input/output (I/O) pads on the at least one semiconductor die through a plurality of bond wires. The plurality of lead terminals comprises first lead terminals, second lead terminals, and third lead terminals, which are arranged in triple row configuration along at least one side of the semiconductor package. Each of the first lead terminals, second lead terminals, and third lead terminals has an exposed base metal on a cut end thereof.

18 Claims, 4 Drawing Sheets

(56) References Cited

U.S. PATENT DOCUMENTS

2010/0084756 A1\* 4/2010 Dirks .................. H01L 24/49
                                                    257/690
2017/0309550 A1\* 10/2017 Danno ................ H01L 24/97

\* cited by examiner

MULTI-ROW QFN SEMICONDUCTOR PACKAGE

CROSS REFERENCE TO RELATED APPLICATIONS

This application claims the benefit of U.S. provisional application No. 62/865,392 filed Jun. 24, 2019, which is hereby incorporated by reference.

BACKGROUND

The present disclosure relates generally to the field of chip packaging and, more particularly, to a multi-row, sawed-type quad flat non-leaded (QFN) semiconductor package.

The handheld consumer market is aggressive in the miniaturization of electronic products. Driven primarily by the cellular phone and digital assistant markets, manufacturers of these devices are challenged by ever shrinking formats and the demand for more PC-like functionality. Additional functionality can only be achieved with higher performing logic IC's accompanied by increased memory capability. This challenge, combined together in a smaller PC board format, asserts pressure on surface mount component manufactures to design their products to command the smallest area possible.

Many of the components used extensively in today's handheld market have been migrated from traditional leaded frame designs to non-leaded formats. The primary driver for handheld manufacturers is the saved PC board space created by these components' smaller mounting areas. In addition, most components also have reductions in weight and height, as well as an improved electrical performance. As critical chip scale packages are converted to non-leaded designs, the additional space saved can be allocated to new components for added device functionality.

Further, the I/O density of current leadframe package is still low. Although advanced QFN (aQFN) package can provide high I/O density, the conventional aQFN packages have SMT solder inspection issue. Nonleaded designs use wire bond as the primary interconnection between the IC and the frame. However, due to the unique land site geometry and form factor density, traditional wire bond processes may not produce high yielding production. For these designs, additional wire bond capabilities are needed to produce acceptable production yields.

SUMMARY

It is one objective to provide a multi-row, sawed-type quad flat non-leaded (QFN) semiconductor package capable of solving the shortcomings of the prior art.

One aspect of the present disclosure provides a semiconductor package including at least one die attach pad of a leadframe, at least one semiconductor die mounted on the at least one die attach pad; and a plurality of lead terminals disposed around the at least one die attach pad and electrically connected to respective input/output (I/O) pads on the at least one semiconductor die through a plurality of bond wires. The plurality of lead terminals comprises first lead terminals, second lead terminals, and third lead terminals, which are arranged in triple row configuration along at least one side of the semiconductor package. Each of the first lead terminals, second lead terminals, and third lead terminals has an exposed base metal on a cut end thereof.

According to one embodiment, the cut end is vertically flush with a sidewall surface of the semiconductor package.

According to one embodiment, the semiconductor package further comprises a molding compound encapsulating the at least one semiconductor die, the at least one die attach pad, the plurality of bond wires, and the plurality of lead terminals.

According to one embodiment, the cut end is vertically flush with a sidewall surface of the molding compound.

According to one embodiment, the first lead terminals, second lead terminals, and third lead terminals are arranged in a staggered manner.

According to one embodiment, the third lead terminals are disposed in an inner row that is proximate to the I/O pads on the at least one semiconductor die, the second lead terminals are disposed in a middle row, and the third lead terminals are disposed in an outer row.

According to one embodiment, each of the third lead terminals has a pad portion for wire-bonding and a connection tie bar, wherein the cut end is disposed on an end of the connection tie-bar.

According to one embodiment, the connection tie-bar extends between one of the second lead terminals and one of the first lead terminals.

According to one embodiment, the connection tie-bar is linear shaped.

According to one embodiment, the connection tie-bar has a curved shape or a serpentine shape.

According to one embodiment, each of the second lead terminals has a pad portion for wire-bonding and a connection tie bar.

According to one embodiment, the pad portion of each of the third lead terminals has a surface area that is greater than that of the pad portion of each of the second lead terminals.

According to one embodiment, the semiconductor package further comprises a ground ring surrounding the die attach pad.

According to one embodiment, the ground ring is half-etched and is not exposed from a bottom of the semiconductor package.

Another aspect of the present disclosure provides an electronic system including a semiconductor package comprising a die attach pad of a leadframe, a semiconductor die mounted on the die attach pad, and a plurality of lead terminals disposed around the die attach pad and electrically connected to respective input/output (I/O) pads on the at least one semiconductor die through a plurality of bond wires. The plurality of lead terminals comprises first lead terminals, second lead terminals, and third lead terminals, which are arranged in triple row configuration along at least one side of the semiconductor package. Each of the first lead terminals, second lead terminals, and third lead terminals has an exposed base metal on a cut end thereof. The semiconductor package is mounted on a printed circuit board.

According to one embodiment, the printed circuit board comprises a pad corresponding to the die attach pad and at least one finger pad corresponding to at least one of the plurality of the lead terminals.

According to one embodiment, the die attach pad is adhered to the pad by using an adhesive layer.

According to one embodiment, the at least one of the plurality of lead terminals is bonded to the at least one finger pad through solder paste, and wherein wicking of the solder paste up to the base metal on the cut end forms a solder fillet so that evidence of a solder joint is readily inspectable by an inspector or automated inspection tool.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention can be more fully understood by reading the subsequent detailed description and examples with references made to the accompanying drawings, wherein.

DETAILED DESCRIPTION

Figure 1:
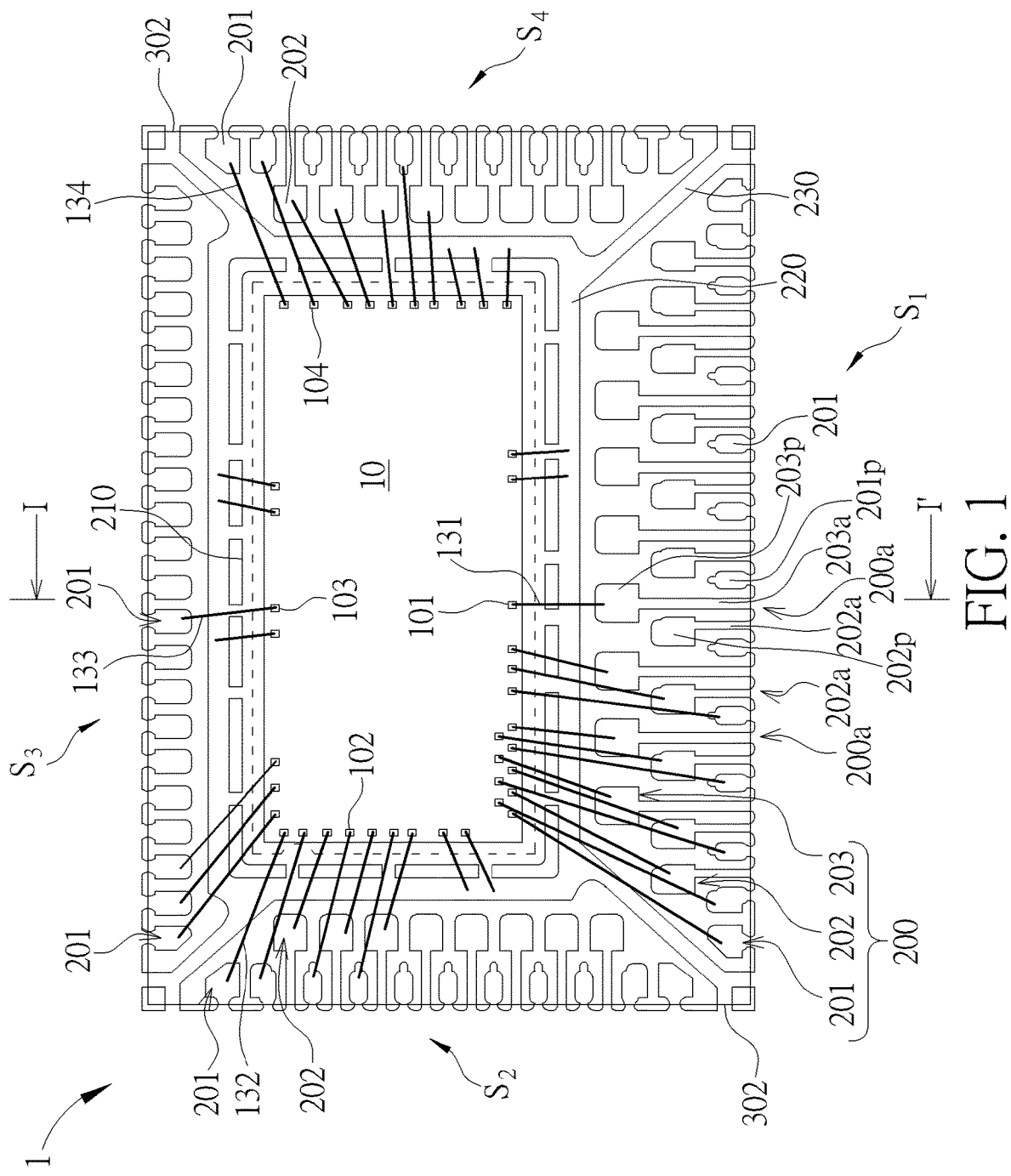
FIG. 1 is a schematic perspective top view of an exemplary sawed-type QFN semiconductor package having multi-row lead terminals in accordance with one embodiment of the invention.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes stamping, forging, patterning, exposure, development, etching, cleaning, and/or removal of the material or laser trimming as required in forming a described structure. The term "system" as used herein means and refers to the method and to the apparatus of the present invention in accordance with the context in which the term is used.

The present disclosure pertains to an improved sawed-type QFN semiconductor package with multi-row terminals arranged along at least one side of the sawed-type QFN semiconductor package. It is advantageous to use the present invention because the package size can be reduced (~20% reduction in size) and the performance of the semiconductor package can be improved because of the reduced lengths of the wire bonds.

Generally, a leadframe strip is populated with a plurality of leadframes. A semiconductor die or microelectronic device may be mounted on each leadframe and encapsulated with a mold compound. Leadframes are separated during singulation of the strip to create individual semiconductor packages. One type of the semiconductor packages is a flat-pack no-lead package where each terminal is exposed at a bottom and at a side of the package. The sawing process during singulation of the strip typically results in lead terminals that have at least some exposed base metal on a cut end, or flank, of each lead terminal. The aforesaid cut end is vertically flush with a sidewall surface of the package or the sidewall surface of a molding compound.

A solder fillet is an extension of the solder joint at an end, or flank, of each lead terminal of a flat-pack no-lead package. A presence or absence of a solder fillet can be evidence of the quality of electrical connection between a terminal of a flat-pack no-lead package and a printed circuit board (PCB). For the conventional aQFN semiconductor packages, a solder fillet may not be seen during visual inspection. Therefore, the conventional aQFN packages have SMT solder inspection issue.

Figure 2:
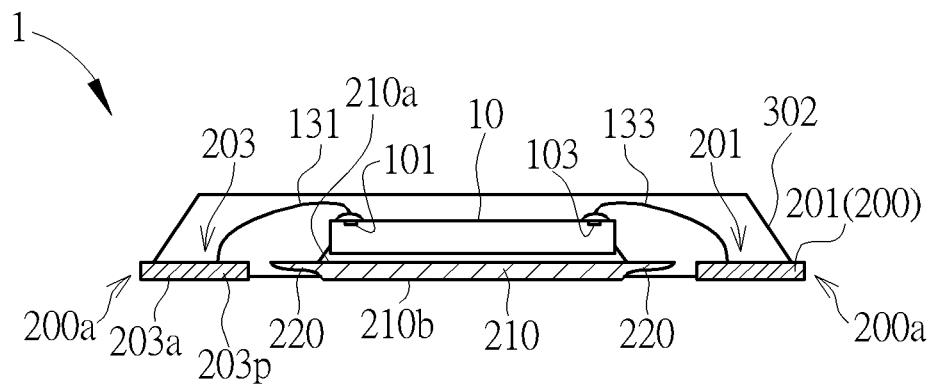
FIG. 2 is a schematic, cross-sectional view taken along line I-I' in FIG. 1.

FIG. 1 is a schematic, perspective top view of an exemplary sawed-type quad flat non-leaded (QFN) semiconductor package having multi-row lead terminals in accordance with one embodiment of the invention. FIG. 2 is a schematic, cross-sectional view taken along line I-I' in FIG. 1. For example, the exemplary sawed-type QFN semiconductor package (hereinafter QFN package) in FIG. 1 may have 92 lead terminals (or pins) and a dimension of 8.7 mm×6.0 mm. However, it is to be understood that the number of lead terminals and dimension of the QFN package are for illustration purposes only.

As shown in FIG. 1 and FIG. 2, the QFN package 1 comprises a plurality of lead terminals 200 disposed around a die attach pad 210 that is supported in a central region by four fishtail tie-bars 230 extending at the four corners of the QFN package 1. The QFN package 1 has a rectangular outline and has four sides $S_1$~$S_4$. The first side $S_1$ is opposite to the third side $S_3$ and the second side $S_2$ is opposite to the fourth side $S_4$. Optionally, a ground ring 220 may be disposed between the plurality of lead terminals 200 and the die attach pad 210.

According to one embodiment, at least one semiconductor die 10 is mounted on a top surface 210a of the die attach pad 210. The plurality of lead terminals 200, the semiconductor die 10, the die attach pad 210, and the fishtail tie-bars 230 are encapsulated by a molding compound 302. Each of the plurality of lead terminals 200 has at least an exposed base metal 200a on an outer end, or flank, of each lead terminal 200. The bottom surface 210b of the die attach pad 210 may be exposed from a bottom of the QFN package 1 and may be connected to a ground plane and/or heat-dissipating plugs (not shown) in a printed circuit board (PCB). According to one embodiment, the ground ring 220 is half-etched from the bottom and is not exposed from the bottom of the QFN package 1.

According to one embodiment, the plurality of lead terminals 200 comprises a plurality of first lead terminals 201 arranged in a first row (or outer row) that is disposed along the four sides $S_1$~$S_4$ of the QFN package 1. According to one embodiment, the plurality of lead terminals 200 comprises a plurality of second lead terminals 202 arranged in a second row (or middle row) that may be disposed along at least one of the four sides, for example, the first side $S_1$, the second side $S_2$ and the fourth side $S_4$, of the QFN package 1. According to one embodiment, the plurality of lead terminals 200 comprises a plurality of third lead terminals 203 arranged in a third row (or inner row) that may be disposed along at least one of the four sides, for example, the first side $S_1$, of the QFN package 1. Accordingly, the QFN package 1 comprises a triple-row lead configuration on the first side $S_1$ and dual-row lead configuration on the second side $S_2$ and fourth side $S_4$.

The semiconductor die 10 comprises a plurality of input/output (I/O) pads 101~104 disposed along the perimeter of the semiconductor die 10. According to a non-limiting embodiment, for example, the I/O pads 101 of the semiconductor die 10 may be disposed along the first side $S_1$ of the QFN package 1 and may be electrically connected to the lead terminals 200 on the first side $S_1$ by bond wires 131. According to a non-limiting embodiment, the wire bonds 131 may be copper wires. Since the third lead terminals 203 in the inner row is proximate to the I/O pads 101, the length of the wire bonds 131 can be reduced and the electrical performance of the QFN package 1 can be improved.

According to a non-limiting embodiment, for example, the I/O pads 102 and 104 of the semiconductor die 10 may be disposed along the second side $S_2$ and the fourth side $S_4$ of the QFN package 1, respectively, and may be electrically connected to the lead terminals 200 on the second side $S_2$ and the fourth side $S_4$ by bond wires 132 and 134. For example, the I/O pads 102 and 104 may comprise digital pads, but not limited thereto.

According to a non-limiting embodiment, for example, the I/O pads 103 of the semiconductor die 10 may be disposed along the third side $S_3$ of the QFN package 1 and may be electrically connected to the lead terminals 200 on the third side $S_3$ by bond wires 133. For example, the I/O pads 103 may comprise analog or radio-frequency (RF) pads, but not limited thereto.

As can be seen in FIG. 1 and FIG. 2, each of the lead terminals 203 comprises a pad portion 203$p$ for wire-bonding. The pad portion 203$p$ is connected to a connection tie-bar 203$a$. The connection tie-bar 203$a$ has an exposed base metal 200$a$ on an outer end or flank. The connection tie-bar 203$a$ extends between a lead terminal 202 in the middle row and a lead terminal 201 in the outer row. Likewise, each of the lead terminals 202 in the middle row is composed of a pad portion 202$p$ and a connection tie-bar 202$a$ with an exposed base metal 200$a$ on an outer end or flank. In some embodiments, the connection tie-bar 202$a$ may be nonlinear when viewed from the above. For example, the connection tie-bar 202$a$ may have a cured shape or a serpentine shape.

According to one embodiment, the pad portions 203$p$ in the inner row, the pad portions 202$p$ in the middle row, and the lead terminals 201 in the outer row may be arranged in a staggered manner. According to a non-limiting embodiment, for example, each of the pad portions 203$p$ may have a surface area that is greater than the surface area of each of the pad portions 202$p$. According to a non-limiting embodiment, for example, each of the pad portions 202$p$ may have a surface area that is greater than the surface area of each of the lead terminal 201. The connection tie-bar 203$a$ is narrower than the pad portion 203$p$, and the connection tie-bar 202$a$ is narrower than the pad portion 202$p$ when viewed from the above.

Figure 3:
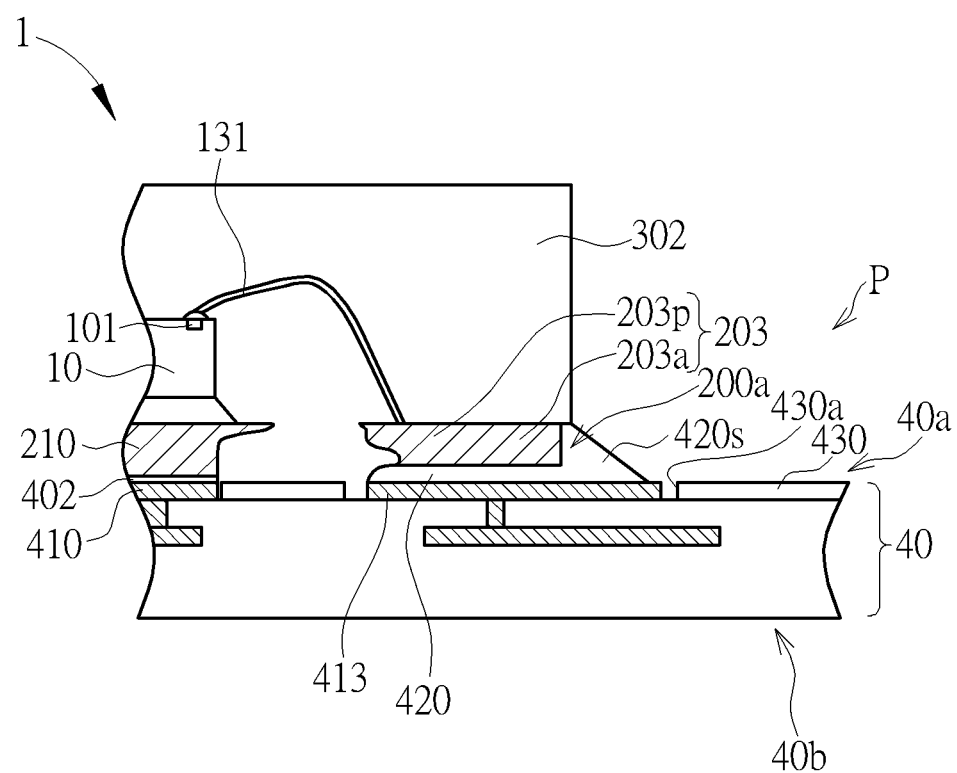
FIG. 3 is a schematic, enlarged diagram showing the solder fillet after the QFN package is mounted on a system substrate or a PCB.

FIG. 3 is a schematic, enlarged diagram showing a germane portion of an electronic system including the QFN package and the solder fillet in direct contact with the base metal on the cut end of the lead terminal after the QFN package is mounted on a system board or a PCB. As shown in FIG. 3, the electronic system P comprises the multi-row, sawed-type QFN semiconductor package 1 as depicted in FIG. 1, which is mounted on a system board or a PCB 40. The system board or PCB 40 has an upper surface 40$a$ and a lower surface 40$b$ that is opposite to the upper surface 40$a$. A pad 410 corresponding to the die attach pad 210 and at least one finger pad 413 corresponding to the lead terminal 203 are disposed on the upper surface 40$a$. The at least one finger pad 413 may be defined within an opening 430$a$ of a solder mask 430. According to a non-limiting embodiment, for example, the die attach pad 210 may be adhered to the pad 410 by using an adhesive layer 402, but not limited thereto. According to a non-limiting embodiment, for example, the adhesive layer 402 may be a conductive adhesive layer such as a silver epoxy, but not limited thereto. According to a non-limiting embodiment, for example, the lead terminal 203 is bonded to the at least one finger pad 413 through solder paste 420. Wicking of the solder paste 420 up to the base metal 200$a$ on the cut end of the lead terminal 203 forms the solder fillet 420$s$ so that the evidence of a solder joint is readily inspectable by an inspector or automated inspection tool.

Figure 4:
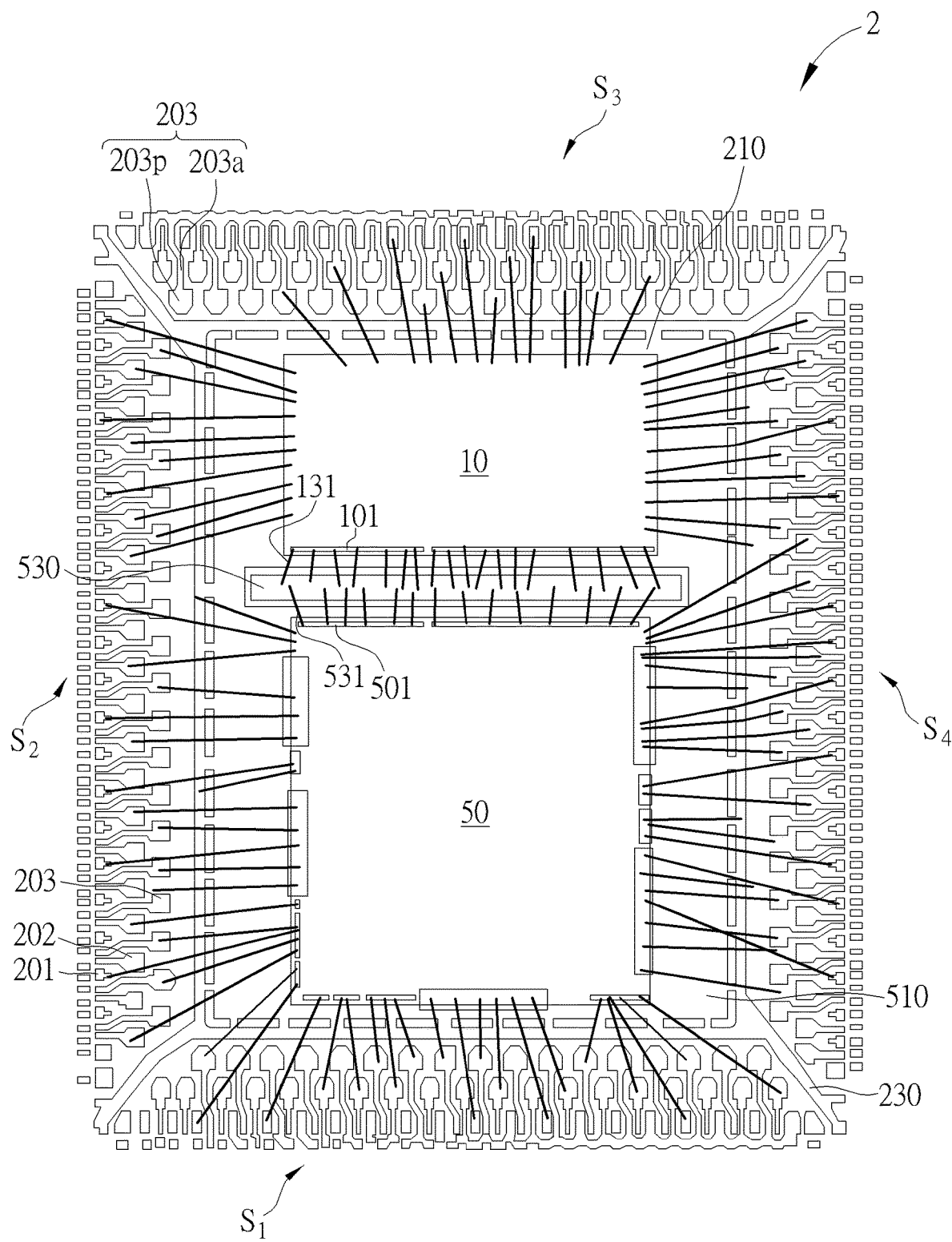
FIG. 4 is a schematic, top view of an exemplary sawed-type QFN semiconductor package having multi-row lead terminals in accordance with one embodiment of the invention.

FIG. 4 is a schematic, top view of an exemplary sawed-type QFN semiconductor package having multi-row lead terminals in accordance with one embodiment of the invention, wherein like elements, layers or regions are designated by like numeral numbers. As shown in FIG. 4, the exemplary sawed-type QFN semiconductor package 2 has two die attach pads 210 and 510, on which a first semiconductor die 10 and a second semiconductor die 50 are mounted. According to a non-limiting embodiment, for example, the first semiconductor die 10 may comprise a processor chip or controller, but not limited thereto. According to a non-limiting embodiment, for example, the second semiconductor die 50 may comprise a WiFi and Bluetooth chipset; in other example, the second semiconductor die 50 may comprise a memory chipset, such as DRAM memory or Flash memory, but not limited thereto.

The sawed-type QFN semiconductor package 2 has triple-row lead configuration along its four sides $S_1$~$S_4$ so as to achieve a higher I/O density (up to 242 lead counts at a pitch of 0.63 mm). It is noteworthy that the I/O pads 501 disposed along the edge of the second semiconductor die 50, which directly faces the first semiconductor die 10, and the I/O pads 101 disposed along the edge of the first semiconductor die 10, which directly faces the second semiconductor die 50, may be wire-bonded to an middle pad 530 between the first semiconductor die 10 and the second semiconductor die 50.

Figure 5:
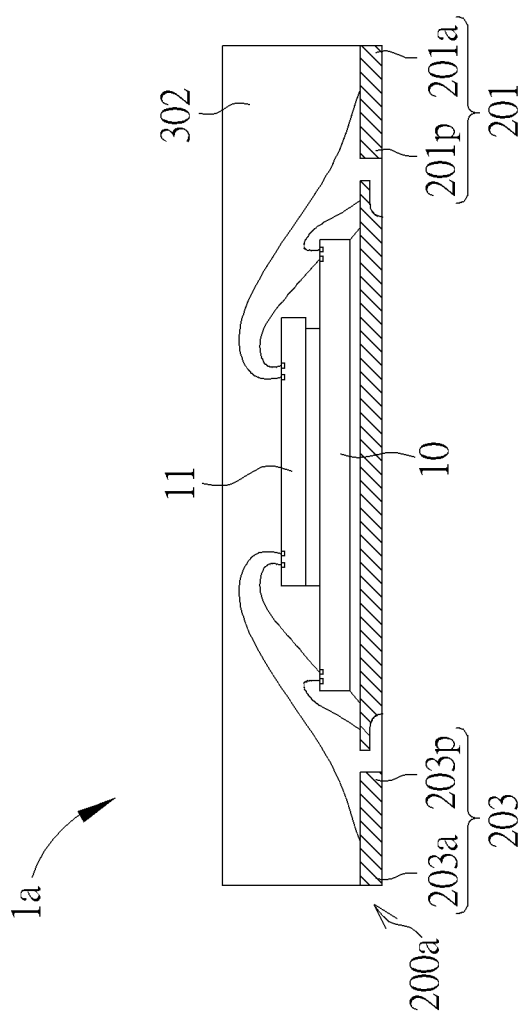
FIG. 5 is a schematic, cross-sectional diagram showing a multi-chip QFN package in accordance to another embodiment of the invention.

FIG. 5 is a schematic, cross-sectional diagram showing a multi-chip QFN package in accordance to another embodiment of the invention, wherein like elements, layers or regions are designated by like numeral numbers. According to another embodiment, there may be two or more semiconductor dies 10 on the top surface 210$a$ of the die attach pad 210. As shown in FIG. 5, the QFN package 1$a$ comprises a second semiconductor die 11 that is mounted directly on the top of the first semiconductor die 10. According to a non-limiting embodiment, for example, the first semiconductor die 10 may comprise a processor chip or controller, but not limited thereto. According to a non-limiting embodiment, for example, the second semiconductor die 11 may comprise a WiFi and Bluetooth chipset; in other example, the second semiconductor die 11 may comprise a memory chipset, such as DRAM memory or Flash memory, but not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
at least one die attach pad of a leadframe;
at least one semiconductor die mounted on the at least one die attach pad; and
a plurality of lead terminals disposed around the at least one die attach pad and electrically connected to respective input/output (I/O) pads on the at least one semiconductor die through a plurality of bond wires, wherein the plurality of lead terminals comprises first lead terminals, second lead terminals, and third lead terminals, which are arranged in triple row configuration along at least one side of the semiconductor package, and wherein each of the first lead terminals, second lead terminals, and third lead terminals has an exposed base metal on a cut end thereof, wherein the exposed base metal has a bottom surface exposed from a bottom of the semiconductor package and has a thickness that is equal to that of wire-bonded pad portions of each of the first lead terminals, the second lead terminals, and the third lead terminals.

2. The semiconductor package according to claim 1, wherein the cut end is vertically flush with a sidewall surface of the semiconductor package.

3. The semiconductor package according to claim 1 further comprising:
a molding compound encapsulating the at least one semiconductor die, the at least one die attach pad, the plurality of bond wires, and the plurality of lead terminals.

4. The semiconductor package according to claim 3, wherein the cut end is vertically flush with a sidewall surface of the molding compound.

5. The semiconductor package according to claim 1, wherein the first lead terminals, second lead terminals, and third lead terminals are arranged in a staggered manner.

6. The semiconductor package according to claim 1, wherein the third lead terminals are disposed in an inner row that is proximate to the I/O pads on the at least one semiconductor die, the second lead terminals are disposed in a middle row, and the first lead terminals are disposed in an outer row.

7. The semiconductor package according to claim 6, wherein each of the third lead terminals has a pad portion for wire-bonding and a connection tie bar, wherein the cut end is disposed on an end of the connection tie-bar.

8. The semiconductor package according to claim 7, wherein the connection tie-bar extends between one of the second lead terminals and one of the first lead terminals.

9. The semiconductor package according to claim 7, wherein the connection tie-bar is linear shaped.

10. The semiconductor package according to claim 7, wherein the connection tie-bar has a curved shape or a serpentine shape.

11. The semiconductor package according to claim 7, wherein each of the second lead terminals has a pad portion for wire-bonding and a connection tie bar.

12. The semiconductor package according to claim 11, wherein the pad portion of each of the third lead terminals has a surface area that is greater than that of the pad portion of each of the second lead terminals.

13. The semiconductor package according to claim 1 further comprising:
a ground ring surrounding the die attach pad.

14. The semiconductor package according to claim 13, wherein the ground ring is half-etched and is not exposed from a bottom of the semiconductor package.

15. An electronic system, comprising:
a semiconductor package, comprising: a die attach pad of a leadframe; a semiconductor die mounted on the die attach pad; and a plurality of lead terminals disposed around the die attach pad and electrically connected to respective input/output (I/O) pads on the at least one semiconductor die through a plurality of bond wires, wherein the plurality of lead terminals comprises first lead terminals, second lead terminals, and third lead terminals, which are arranged in triple row configuration along at least one side of the semiconductor package, and wherein each of the first lead terminals, second lead terminals, and third lead terminals has an exposed base metal on a cut end thereof, wherein the exposed base metal has a bottom surface exposed from a bottom of the semiconductor package and has a thickness that is equal to that of wire-bonded pad portions of each of the first lead terminals, the second lead terminals, and the third lead terminals; and
a printed circuit board, wherein the semiconductor package is mounted on the printed circuit board.

16. The electronic system according to claim 15, wherein the printed circuit board comprises a pad corresponding to the die attach pad and at least one finger pad corresponding to at least one of the plurality of the lead terminals.

17. The electronic system according to claim 16, wherein the die attach pad is adhered to the pad by using an adhesive layer.

18. The electronic system according to claim 16, wherein the at least one of the plurality of lead terminals is bonded to the at least one finger pad through solder paste, and wherein wicking of the solder paste up to the base metal on the cut end forms a solder fillet.

* * * * *